(12) United States Patent
Chae et al.

(10) Patent No.: US 9,746,499 B2
(45) Date of Patent: Aug. 29, 2017

(54) HYBRID CURRENT SENSOR ASSEMBLY

(71) Applicant: Tyco Electronics AMP Korea Ltd, Gyungsangbuk-do (KR)

(72) Inventors: Hong Il Chae, Gyungsangbuk-do (KR); You Sik Choi, Gyungsangbuk-do (KR); Shin Wook Kang, Gyungsangbuk-do (KR); Young Woon Kim, Gyungsangbuk-do (KR)

(73) Assignee: Tyco Electronics AMP Korea Ltd, Gyungsangbuk-do (KR)

( * ) Notice: Subject to any disclaimer, the term of this patent is extended or adjusted under 35 U.S.C. 154(b) by 60 days.

(21) Appl. No.: 14/697,752

(22) Filed: Apr. 28, 2015

(65) Prior Publication Data

US 2015/0309080 A1    Oct. 29, 2015

(30) Foreign Application Priority Data

Apr. 28, 2014  (KR) .................. 10-2014-0050656
Sep. 18, 2014  (KR) .................. 10-2014-0124358

(51) Int. Cl.
*G01R 15/20*  (2006.01)
*G01R 1/20*   (2006.01)
(Continued)

(52) U.S. Cl.
CPC .......... *G01R 15/202* (2013.01); *G01R 1/203* (2013.01); *G01R 15/08* (2013.01); *G01R 15/142* (2013.01); *G01R 15/146* (2013.01); *G01R 15/207* (2013.01)

(58) Field of Classification Search
USPC .... 324/251, 244, 200, 426, 126, 252, 117 R, 324/123 R, 117 H, 207.2, 225, 260, 76.11,
(Continued)

(56) References Cited

U.S. PATENT DOCUMENTS

2003/0227285 A1* 12/2003 Marasch ............. G01R 15/202
324/117 R
2004/0196024 A1* 10/2004 Stauth .................. G01R 15/202
324/117 R
(Continued)

FOREIGN PATENT DOCUMENTS

EP         2667397 A2    11/2013
KR       20110017774 A    2/2011

OTHER PUBLICATIONS

European Search Report, App. No. 15164539.7-1560, dated Oct. 8, 2015, 9 pages.
Abstract of KR20110017774(A), dated Feb. 22, 2011, 1 page.

*Primary Examiner* — Melissa Koval
*Assistant Examiner* — Nasima Monsur
(74) *Attorney, Agent, or Firm* — Barley Snyder

(57) ABSTRACT

A hybrid current sensor assembly has a conductor, Hall core, Hall sensor, shunt terminal, and a microprocessor. The conductor has a first terminating end and a second terminating end. The Hall core generates a magnetic field from current flow in the conductor. The Hall sensor measures potential difference between first terminating end and the second terminating end of the conductor based on the magnetic field applied to the Hall core. The shunt terminal is positioned on a central portion of the conductor. The microprocessor is connected to the shunt terminal to measure the current flow in the conductor.

10 Claims, 9 Drawing Sheets

(51) Int. Cl.
*G01R 15/08* (2006.01)
*G01R 15/14* (2006.01)

(58) Field of Classification Search
USPC ....... 324/151 A, 750.3; 702/104, 64; 361/57
See application file for complete search history.

(56) References Cited

U.S. PATENT DOCUMENTS

2006/0158176 A1* 7/2006 Preusse ................ G01R 15/185
 324/117 R
2007/0279175 A1 12/2007 Lin
2013/0314827 A1* 11/2013 Sohn .................... H01H 71/125
 361/57

\* cited by examiner

HYBRID CURRENT SENSOR ASSEMBLY

CROSS-REFERENCE TO RELATED APPLICATION

This application claims the benefit of the filing date under 35 U.S.C. §119(a)-(d) or (f) of Korean Patent Application No. 10-2014-0050656, filed on Apr. 28, 2014, and to Korean Patent Application No. 10-2014-0124358, filed on Sep. 18, 2014.

FIELD OF THE INVENTION

The invention is generally related to a hybrid electrical current sensor assembly, and, more specifically, to a hybrid electrical current sensor assembly having multiple types of integrated sensors.

BACKGROUND

A current sensor is an electronic component that senses an electric current. The current sensor can be one of various types, for example, a Hall sensor and a shunt sensor.

A Hall effect refers to a physical phenomenon in which a potential difference occurs at both ends of an electrical conductor when a magnetic field is interlinked with the conductor in which an electric current flows. The potential difference induced by such a Hall effect is proportional to the interlinked magnetic field. Using the Hall effect, a Hall sensor sends a bias current to the conductor to measure the potential difference at the both ends and measure a strength of the magnetic field. An example of a Hall sensor is shown in Korean Patent Publication No. 10-2011-0017774.

The Hall sensor and the shunt sensor have respective advantages and disadvantages. Generally, one of the two sensors is selectively used based on each's performance and the specific application's requirements. However, recent reinforcement of safety specifications requires use of both. Accordingly, the production cost and the volume of the produced product increase when the two sensors are independently installed in the end product.

Consequently, if the two sensors were integrated into a single unit in an efficient manner, the production cost and volume of the final product could both be decreased.

SUMMARY

One of the objects of the invention, among others, is to address the disadvantages discussed above.

A hybrid current sensor assembly has a conductor, Hall core, Hall sensor, shunt terminal, and a microprocessor. The conductor has a first terminating end and a second terminating end. The Hall core generates a magnetic field from current flow in the conductor. The Hall sensor measures potential difference between first terminating end and the second terminating end of the conductor based on the magnetic field applied to the Hall core. The shunt terminal is positioned on a central portion of the conductor. The microprocessor is connected to the shunt terminal to measure the current flow in the conductor.

BRIEF DESCRIPTION OF THE DRAWINGS

The invention will be described by way of example, with reference to the accompanying Figures, of which.

DETAILED DESCRIPTION OF THE EMBODIMENT(S)

Figure 1:
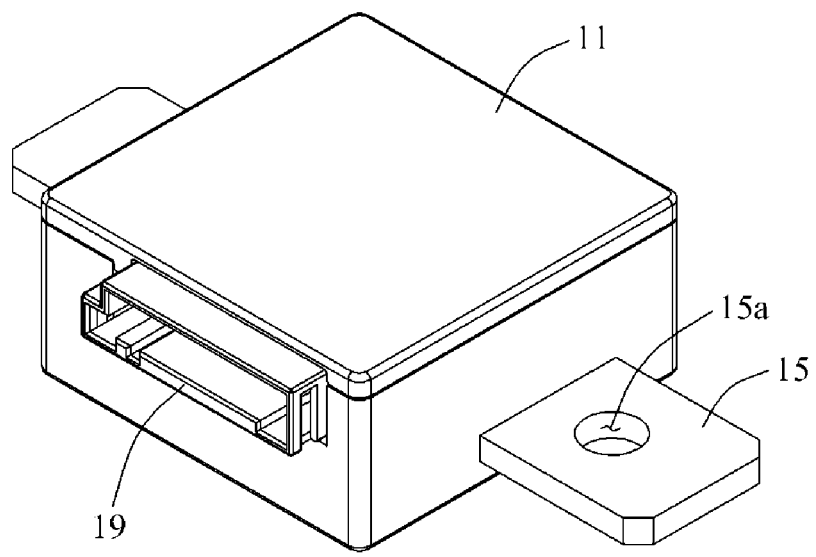
FIG. 1 is a perspective view of a hybrid current sensor assembly.

Hereinafter, exemplary embodiments will be described in detail with reference to the accompanying drawings. Regarding the reference numerals assigned to the elements in the drawings, it should be noted that the same elements will be designated by the same reference numerals, wherever possible, even though they are shown in different drawings. Also, in the description of embodiments, detailed description of well-known related structures or functions will be omitted when it is deemed that such description will cause ambiguous interpretation of the disclosure.

In addition, terms such as first, second, A, B, (a), (b), and the like may be used herein to describe components. Each of these terminologies is not used to define an essence, order or sequence of a corresponding component but used merely to distinguish the corresponding component from other component(s). It should be noted that if it is described in the specification that one component is "connected", "coupled", or "joined" to another component, a third component may be "connected", "coupled", and "joined" between the first and second components, although the first component may be directly connected, coupled or joined to the second component.

The terminology used herein is for the purpose of describing particular embodiments only and is not intended to be limiting. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

A battery management system (BMS) of an electric vehicle (EV), a hybrid electric vehicle (HEV), and a plug-in hybrid electric vehicle (PHEV) may use a voltage value or a current value to calculate a state of charge (SoC) and a state of health (SoH).

According to an embodiment, a hybrid current sensor is positioned by combining a Hall current sensor and a shunt current sensor and thus, may have a redundancy dual output and low and high current ranges.

Figure 2:
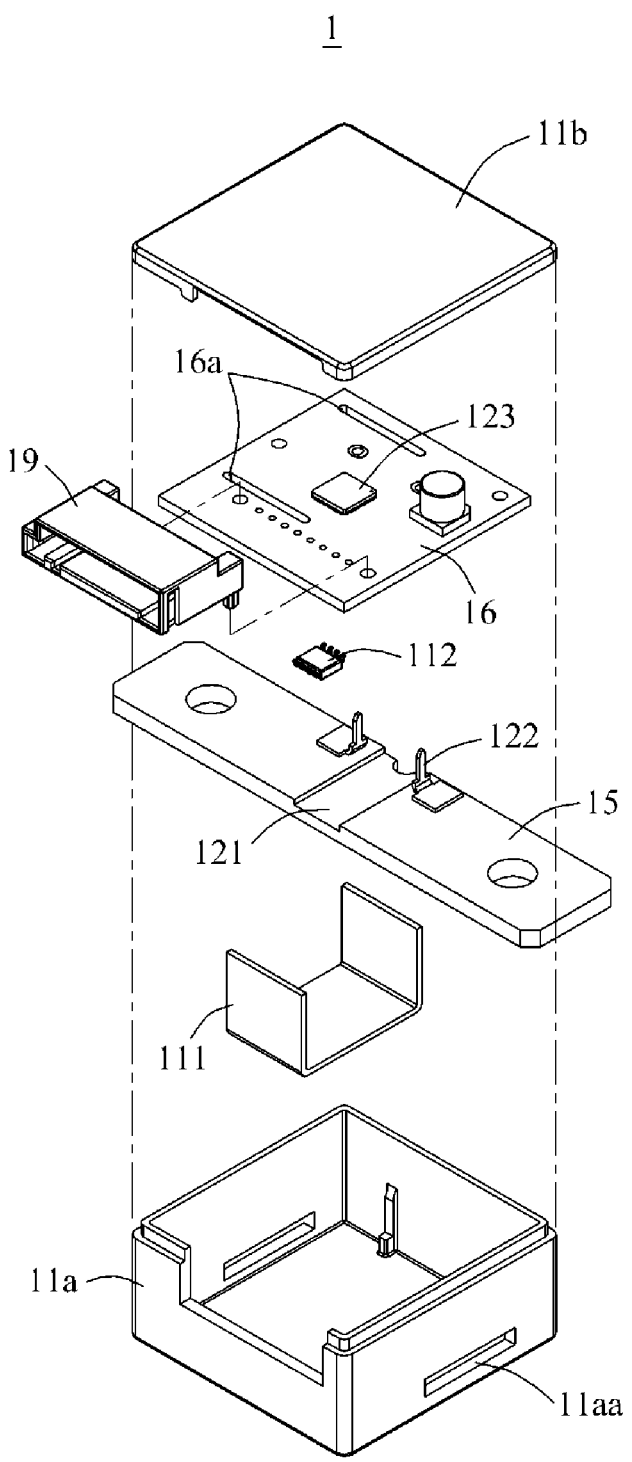
FIG. 2 is an exploded perspective view of the hybrid current sensor assembly.
Figure 3:
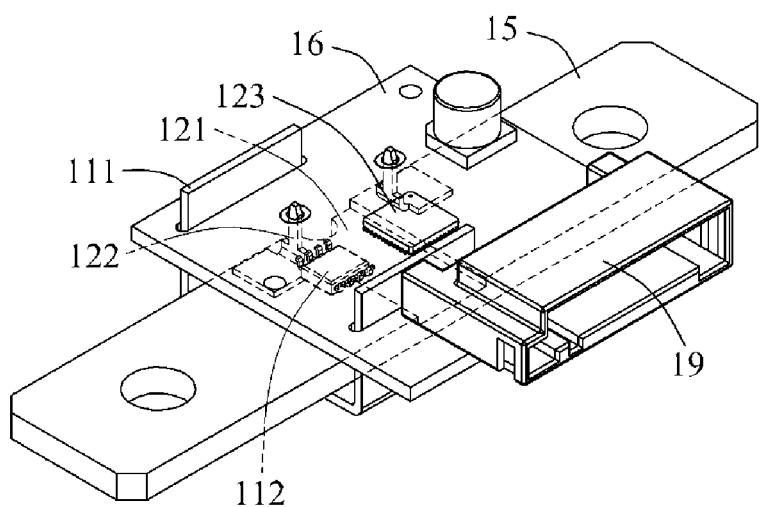
FIG. 3 is a perspective view of an internal structure of the hybrid current sensor assembly.

In the embodiments shown in FIGS. 1-3, a hybrid current sensor assembly 1 can be connected to an external electronic device (not shown) and configured to measure a value of a current flowing in the electronic device. The hybrid current sensor assembly 1 includes a housing 11, a conductor 15, a circuit board 16, a connector 19, a Hall core 111, a Hall sensor 112, a shunt resistance 121, a shunt terminal 122, and a microprocessor 123.

The housing 11 forms an exterior of the hybrid current sensor assembly 1. In an embodiment, the housing 11 is has a rectangular shape. However, the shape of the housing 11 is not limited to being rectangular, and may be any other suitable shape. The housing 11 includes a housing body 11a and a housing cover 11b.

The housing body 11a has a component receiving space in the central interior, and a conductor receiving passageway 11aa into which the conductor 15 is inserted. In an embodiment, the conductor receiving passageway 11aa is a slot positioned to correspondingly face two side faces of the housing body 11a. A first connector receiving space into which the connector 19 is inserted is positioned at one side of the housing body 11a. In an embodiment, the first connector receiving space is a groove formed by being recessed into one side of the housing body 11a. In another embodiment, the first connector receiving space is a notch positioned into one side of the housing body 11a.

The housing cover 11b covers at least a portion of the component receiving space of the housing body 11a. A corresponding second connector receiving space to the first connector receiving space, into which the connector 19 is inserted, is positioned on one side of the housing cover 11b. In an embodiment, the second connector receiving space is a groove formed by being recessed at the one side of the housing cover 11b. In another embodiment, the second connector receiving space is a notch position into one side of the housing cover 11b.

At least a portion of the conductor 15 is positioned in the housing 11. The external electronic device is connected to opposite terminating ends of the conductor 15. Proximate to each of the terminating ends of the conductor 15, a connecting mechanism 15a, to which two terminals of the external electronic device are connected, is positioned. In an embodiment, the connecting mechanism 15a is a hole formed in the conductor 15. The conductor 15 extends through the housing 11, with a central region of the conductor being positioned in the component receiving space, and the two terminating ends being positioned externally exposed from the housing 11. In detail, both terminating ends of the conductor 15 are exposed from opposite sides of the housing 11. That is, the both terminating ends of the conductor 15 externally protrude from opposite sides of the housing 11. In an embodiment, the conductor 15 is a plate having a rectangular shape. The conductor 15 is positioned to extend through a center of the Hall core 111.

In the embodiments shown in FIGS. 2 and 3, the Hall sensor 112, the shunt terminal 122, the microprocessor 123, and the connector 19 are positioned in the circuit board 16. The circuit board 16 includes a circuit to connect the electronic components 112,122,123,19 positioned on the circuit board 16 to one another. In an embodiment, the circuit board 16 includes a core receiving passageway 16a into which the Hall core 111 is inserted. In an embodiment, the core receiving passageway 16a is a slot that extends through the circuit board 16. The shape of the core receiving passageway 16a is complimentary to the Hall core 111. In an embodiment, the core receiving passageway 16a is a linearly extending slit.

Both the Hall sensor 112 and the microprocessor 123 are connected to the same circuit board 16. In an embodiment shown in FIGS. 2 and 3, the Hall sensor 112 is connected to a first side of the circuit board 16 and the microprocessor 123 is connected to an opposite second side of the circuit board 16. In an embodiment, the Hall sensor 112 and the microprocessor 123 are positioned to allow at least a portion of each to overlap each other in a vertical direction of the circuit board 16. In this configuration, an area of the circuit board 16 used for installing the Hall sensor 112 and the microprocessor 123 may be reduced, and thus, an overall width of the hybrid current sensor assembly 1 correspondingly be reduced.

In an embodiment (not shown), both the Hall sensor 112 and the microprocessor 123 are both connected to either the first side or the second side of the circuit board 16. In this embodiment, an overall height of the Hall sensor 112, the microprocessor 123, and the circuit board 16 may be reduced and thus, a height of the hybrid current sensor assembly 1 may be reduced.

The connector 19 functions as a path to externally transmit information sensed by the Hall sensor 112 or the microprocessor 123. In addition, the connector 19 functions as a path to supply power to the electronic components arranged in the circuit board 16 from an external source. In the embodiments shown in FIGS. 1 and 2, a portion of the connector 19 is positioned in the housing 11, and a remaining portion is positioned to be externally exposed from the housing 11.

A magnetic field generated by a current flowing in the conductor 15 is applied to the Hall core 111. The Hall core 111 covers at least a portion of the conductor 15. The Hall core 111 covers the portion of the conductor 15 in a direction perpendicular to a longitudinal direction of the conductor 15. The Hall core 111 includes a first surface covering a bottom side of the conductor 15, and a second surface and a third surface bent from opposing edges of the first face and covering both sides of the conductor 15. That is, the Hall core 111 has a flattened U-shape. At least one of the second surface and the third surface of the Hall core 111 is positioned in the core receiving passageways 16a to extend through the circuit board 16.

The Hall sensor 112 senses the current based on the magnetic field applied to the Hall core 111. The Hall sensor 112 is disposed on an inner side of the Hall core 111. A potential difference occurs at both ends of the Hall sensor 112 due to the magnetic field applied to the Hall core 111. In an embodiment, the Hall sensor 112 is positioned at an approximate mid-point between the second surface and the third surface of the Hall core 111. In this embodiment, a sensitivity of the Hall sensor 112 may be improved.

The Hall core 111 and the Hall sensor 112 are collectively referred to as a Hall sensor module 110. The Hall sensor module 110 senses information on the current flowing in the conductor 15 using the Hall effect.

The shunt resistance 121 is disposed on one side of the conductor 15. In an embodiment, the shunt resistance 121 is disposed at an approximate central portion of the conductor 15. The conductor 15 includes a first conducting member (not labeled) and a second conducting member (not labeled) correspondingly connected to both sides of the shunt resistance 121. The first conducting member, the shunt resistance 121, and the second conducting member are sequentially connected in series. In an embodiment, the first conducting member, the shunt resistance 121, and the second conducting member are integrally formed from the same conducting material. A resistance value of the shunt resistance 121 is determined based on a magnitude of the current to be measured.

The shunt terminal 122 shunts the current flowing in the conductor 15. The shunt terminal 122 connects the conductor 15 to the circuit board 16. The shunt terminal 122 allows the microprocessor 123 to be connected in parallel with respect to the conductor 15. The shunt terminal 122 includes a first shunt terminal and a second shunt terminal to connect the first conducting member and the second conducting member to two points of the circuit board 16, respectively. The first shunt terminal and the second shunt terminal are connected to the microprocessor 123. The first shunt terminal and the second shunt terminal (both shown as 122) are disposed on each side of the shunt resistance 121. The first shunt terminal and the second shunt terminal are positioned separate from each other, and are positioned on the first conducting member and the second conducting member, respectively, adjacent to, but not directly, connected to the shunt resistance 121.

In an embodiment, the microprocessor 123 is disposed on an opposite surface of the circuit board 16 than the surface having the Hall sensor 112. In another embodiment, both the Hall sensor 112 and the microprocessor 123 are disposed on the same surface of the circuit board 16. The microprocessor 123 is positioned outside of a central region of the Hall core 111 to reduce any interference of the magnetic field applied to the Hall core 111 on the microprocessor 123.

The microprocessor 123 is connected to the shunt terminal 122 to measure the current flowing in the conductor 15. Thus, in an embodiment, the microprocessor 123 functions as a shunt sensor.

The microprocessor 123 may also measure the current flowing in the conductor 15 based on information sensed by the Hal sensor 112. In such a case, the microprocessor 123 senses the potential difference occurring at both ends of the Hall sensor 112 due to the magnetic field applied to the Hall core 111, and measures the current flowing in the conductor 15. When a value of the current measured by the Hall sensor module 110 is referred to as a first current value, and a value of the current measured by a shunt sensor module 120 is referred to as a second current value, the microprocessor 123 externally transmits, selectively or simultaneously, the first current value and the second current value, out through the connector 19.

Here, the shunt resistance 121, the shunt terminal 122, and the microprocessor 123 are collectively referred to as the shunt sensor module 120. The shunt sensor module 120 measures information on the current flowing in the conductor 15 based on a shunt principle.

Based on a structure of the hybrid current sensor module 1 described in the foregoing, each of the Hall sensor module 110 and the shunt sensor module 120 measures the current flowing in the single conductor 15.

Figure 4:
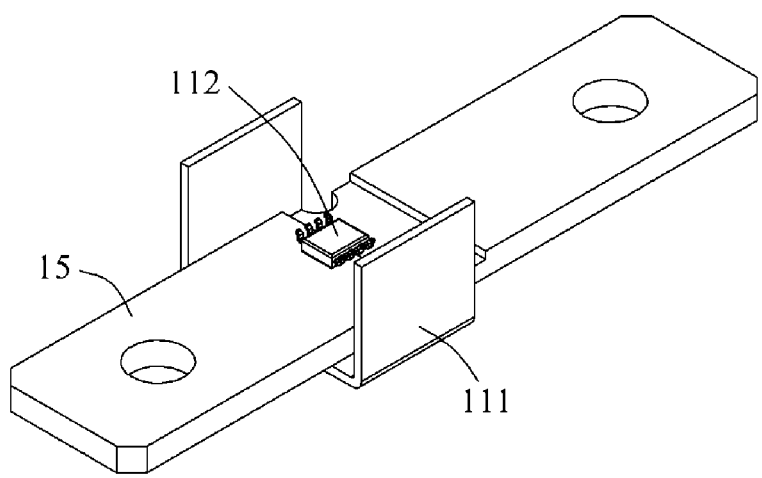
FIG. 4 is a perspective view of a Hall sensor module.

FIG. 4 is a perspective view of the Hall sensor module 110 where the circuit board 16, the shunt terminal 122, and the microprocessor 123 have been removed for illustrative purposes.

In the embodiment shown in FIG. 4, the Hall sensor module 110 includes the conductor 15, the Hall core 111, and the Hall sensor 112.

When a current flows in the conductor 15, a magnetic field proportional to the current flowing in the conductor 15 is induced around the conductor 15 based on Ampere's law. The induced magnetic field magnetizes the Hall core 111, and a magnetic flux amplified at a center of the Hall core 111 in a flattened-U shape may be interlinked. Such a magnetic flux may lead to the Hall effect in the Hall sensor 112. Thus, a voltage, which is a potential difference proportional to the magnetic field induced by the current flowing in the conductor 15, may be output from the Hall sensor 112.

A value output from the Hall sensor 112 is transmitted to the microprocessor 123 and thus, a value of the current flowing in the conductor 15 is measured.

Figure 5:
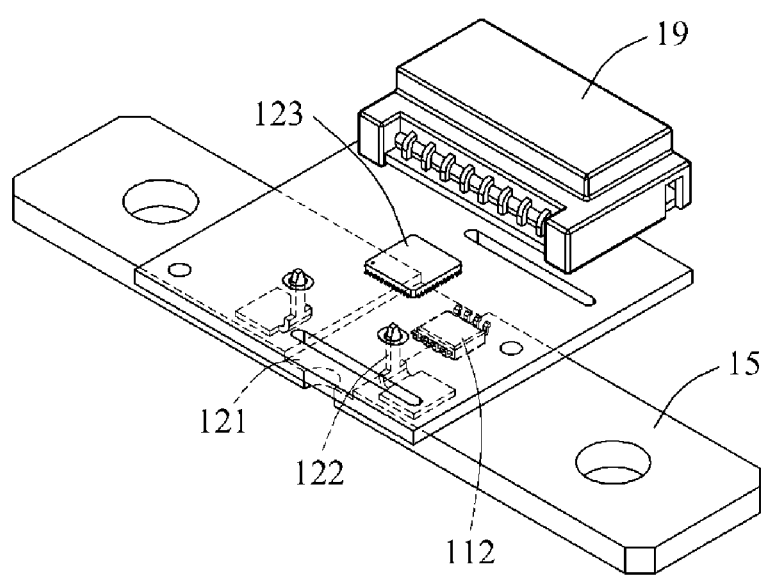
FIG. 5 is a perspective view of a shunt sensor module.

FIG. 5 is a perspective view of the shunt sensor module 120 where the Hall core 111 and other components have been removed for illustrative purposes.

In an embodiment shown in FIG. 5, the shunt sensor module 120 includes the conductor 15, the shunt resistance 121, the shunt terminals 122, and the microprocessor 123.

When a current flows in the conductor 15, the current flowing in the conductor 15 generates a voltage drop in the shunt resistance 121. Since a resistance value of the shunt resistance 121 is predetermined, the microprocessor 123 measures voltage values at a first end and a second end of the shunt resistance 121 and calculates a difference between the voltage values based on Ohm's law to determine a current flowing in the shunt resistance 121.

Table 1 indicates respective performances of the Hall sensor module 110 and the shunt sensor module 120, and a performance of the hybrid current sensor assembly 1 using the Hall sensor module 110 and the shunt sensor module 120.

TABLE 1

| Measured items | Hall sensor | Shunt sensor | Hybrid |
|---|---|---|---|
| Response time | 10 μs | 1000 μs | 10 μs |
| Accuracy | 1.5% | 0.5% | 0.5% |
| Zero offset current | ±1.35 A | ±0.5 A | ±0.5 A |
| Output channel | 1 | 1 | 2 |
| Redundancy | X | X | ○ |

Referring to Table 1, each of the Hall sensor module 110 and the shunt sensor module 120 has advantages and disadvantages based on a measured item. The Hall sensor module 110 has a faster response time to a change in a current. The shunt sensor module 120 has a less zero offset current and a higher accuracy. The hybrid current sensor assembly 1 is a combination of the Hall sensor module 110 and the shunt sensor module 120 and thus, has a complementary advantage and disadvantage of the two sensors. In an embodiment, the hybrid current sensor assembly 1 may use a value measured by at least one of the Hall sensor module 110 and the shunt sensor module 120 depending on a situation, using the microprocessor 123. The Hall sensor module 110 and the shunt sensor module 120 independently measure the current. Thus, when one of the two sensors is broken, the hybrid current sensor assembly 1 may measure the current using the other of the two sensors.

Hereinafter, components performing identical functions to the components described in the foregoing will be referred to using the same names of the components described in the foregoing. Unless otherwise specified, the descriptions provided in the foregoing may be applicable to exemplary embodiments to be described hereinafter, and repeated descriptions will be omitted.

Figure 6:
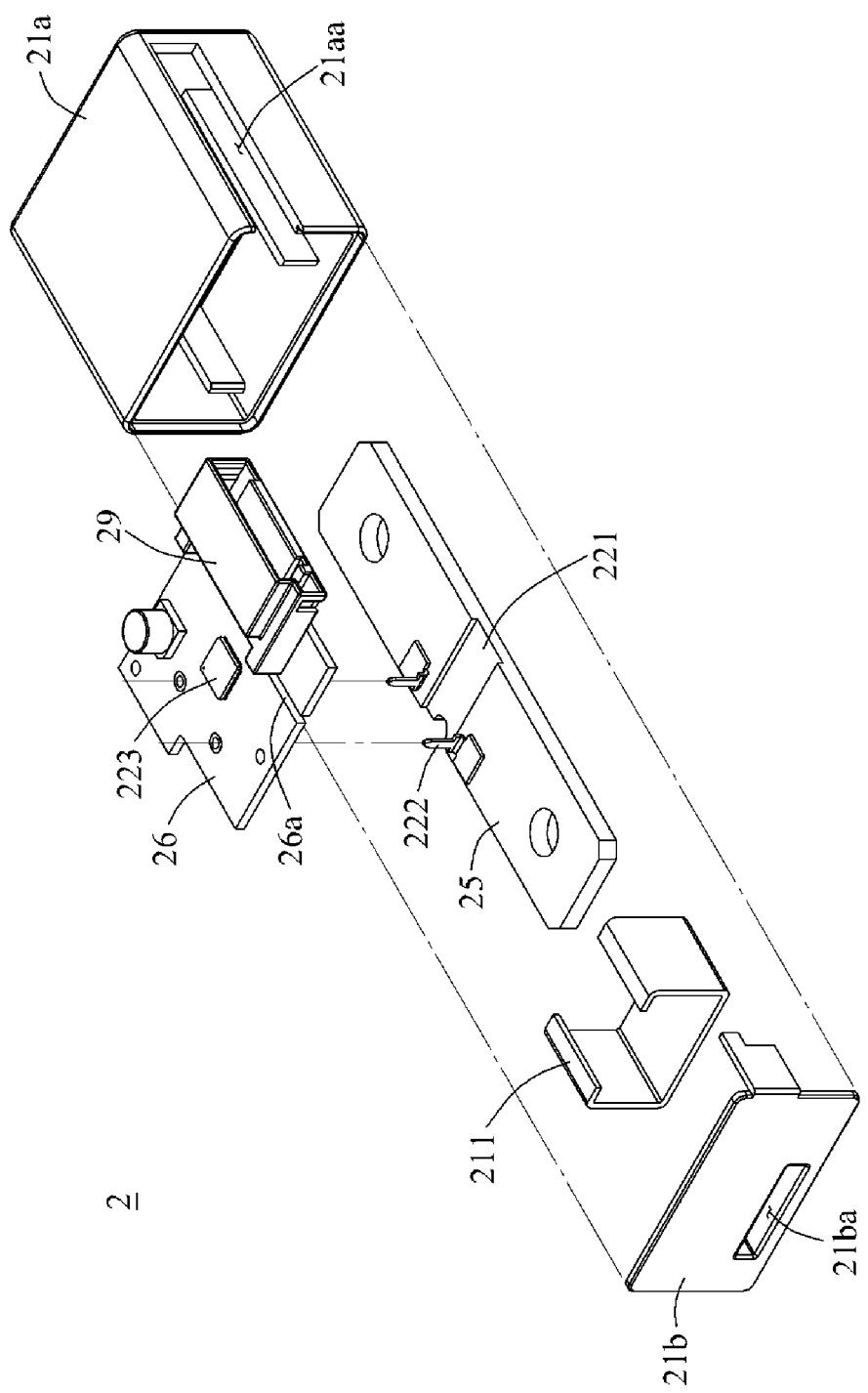
FIG. 6 is an exploded perspective view of a hybrid current sensor assembly.
Figure 7:
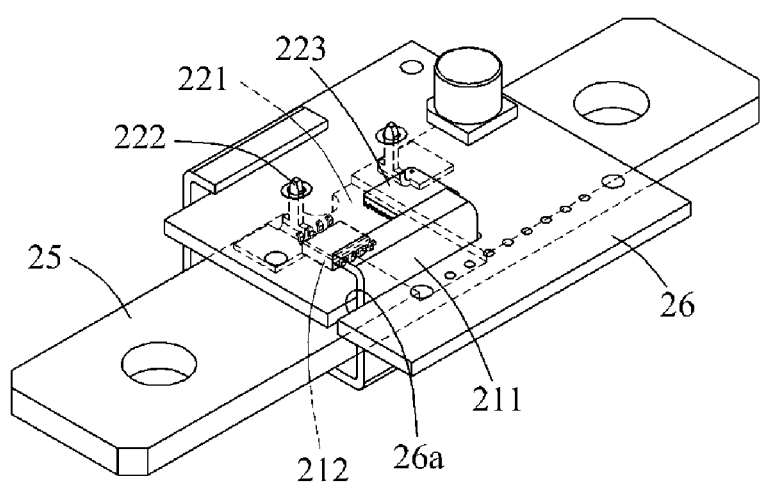
FIG. 7 is a perspective view of an internal structure of the hybrid current sensor assembly of FIG. 6.

In the embodiments shown in FIGS. 6 and 7, a hybrid current sensor assembly 2 includes a housing, a conductor 25, a circuit board 26, a connector 29, a Hall core 211, a Hall sensor 212, a shunt resistance 221, a shunt terminal 222, and a microprocessor 223.

The housing includes a housing body 21a and a housing cover 21b. The housing body 21a has a first conductor receiving passageway (not shown) into which the conductor 25 is inserted. In an embodiment, the first conductor receiving passageway is a slot formed in the housing body 21a. In FIG. 6, the first conductor receiving passageway is positioned on a back face (not shown) of the housing body 21a. The housing body 21a also includes a connector receiving space 21aa into which the connector 29 is inserted. In an embodiment, the connector receiving space 21aa is a groove recessed on one side of the housing body 21a. In another embodiment, the connector receiving space 21aa is a notch recessed on one side of the housing body 21a.

The housing cover 21b includes a second conductor receiving passageway 21ba into which the conductor 25 is inserted. In an embodiment, the second conductor receiving passageway 21ba is a slot formed in the housing cover 21b. The second conductor receiving passageway 21ba is positioned on an opposite face corresponding to the first conductor receiving passageway.

The conductor 25 is positioned to extend through the housing substantially similar to the conductor 15 disclosed above. One terminating end of the conductor 25 extends out of one face of the housing body 21a, and the other terminating end of the conductor 25 extends out of the other opposite face of the housing cover 21b. A central portion of the conductor 25, having the shunt resistance 221, is positioned within a component receiving space (not labeled) positioned within the housing body 21a.

The circuit board 26 has a core receiving passageway 26a into which the Hall core 211 is inserted. In an embodiment shown in FIG. 6, the core receiving passageway 26a is a groove or slot linearly recessed in an inward direction from one edge of the circuit board 26.

The Hall core 211 is positioned to cover the central portion of the conductor 25. The Hall core 211 includes a first surface covering a bottom side of the conductor 25, a second surface and a third surface bent from opposing edges of the first surface and covering both sides of the conductor 15. On an end opposite the first surface, a first end portion and a second end portion bend correspondingly from the second surface and the third surface in a direction in which the first end portion and the second end portion face each other. Based on such a form, a magnetic field to be applied to the Hall core 211 may increase. The Hall core 211 is slidingly connected along the core receiving passageway 26a. As shown in the embodiment of FIG. 7, at least one of the second face and the third face of the Hall core 211 is slidingly received in the core receiving passageway 26a of the circuit board 26.

The Hall core 211 and the Hall sensor 212 are collectively referred to as a Hall sensor module.

The shunt resistance 221, the shunt terminal 222, and the microprocessor 223 are collectively referred to as a shunt sensor module.

Figure 8:
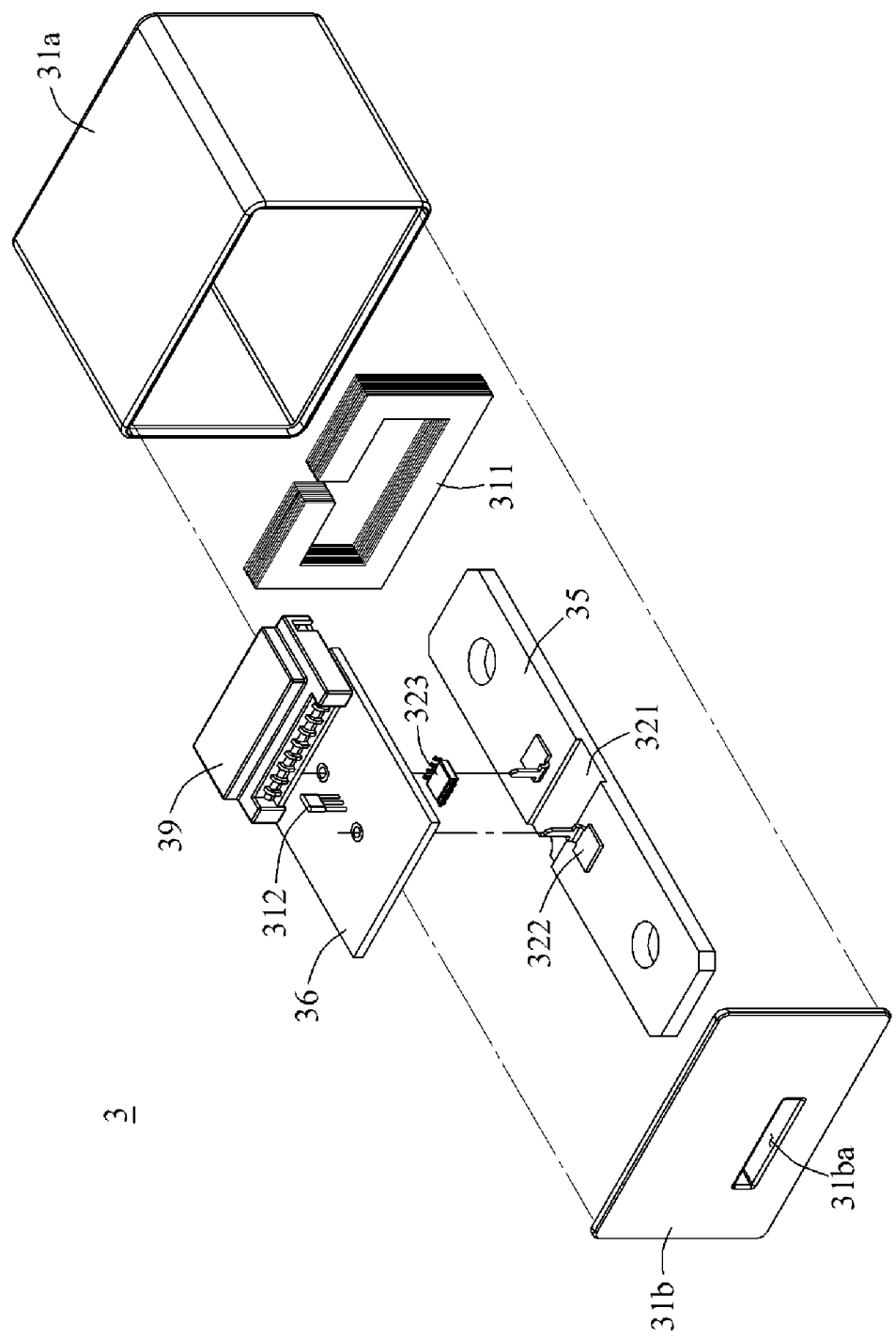
FIG. 8 is an exploded perspective view of a hybrid current sensor assembly.
Figure 9:
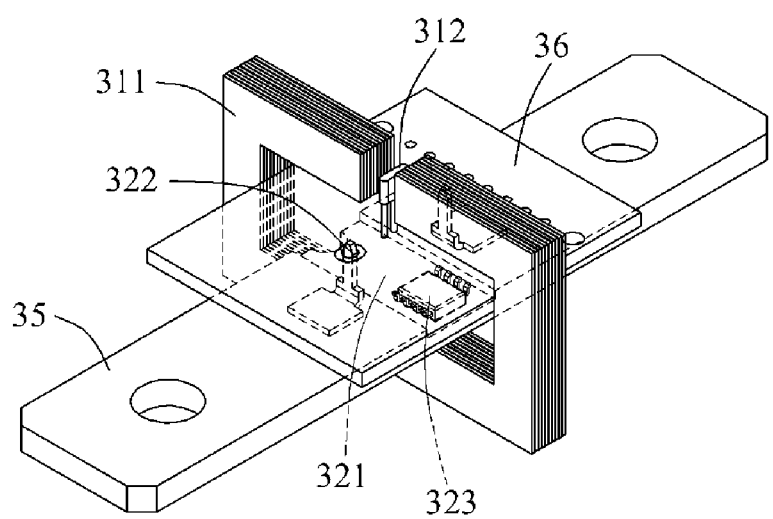
FIG. 9 is a perspective view of an internal structure of the hybrid current sensor assembly of FIG. 8.

In the embodiments shown in FIGS. 8 and 9, a hybrid current sensor assembly 3 has a housing, a conductor 35, a circuit board 36, a connector 39, a Hall core 311, a Hall sensor 312, a shunt resistance 321, a shunt terminal 322, and a microprocessor 323.

The housing includes a housing body 31a and a housing cover 31b. The housing body 31a includes a first conductor receiving passageway (not shown) into which the conductor 35 is inserted. In an embodiment, the first conductor receiving passageway is a slot formed in the housing body 31a. In an embodiment of FIG. 8, the first conductor receiving passageway is formed on a back face of the housing body 31a. The housing body 31a includes a connector receiving space (not shown) into which the connector 39 is inserted. In an embodiment, the connector receiving space is a slot formed on one side of the housing body 31a. In FIG. 8, the connector receiving space is formed on the back face of the housing body 31a. That is, the first conductor receiving passageway and the connector receiving space are formed on the identical face of the housing body 31a.

The housing cover 31b includes a second conductor receiving passageway 31ba into which the conductor 35 is inserted. In an embodiment, the second conductor receiving passageway 31ba is a slot positioned in the housing cover 31b. The second conductor receiving passageway 31ba is formed on an opposite face corresponding to the first conductor receiving passageway on the housing body 31a.

The conductor 35 is positioned to extend through the housing substantially similar to the conductors 15, 25 disclosed above. One terminating end of the conductor 35 extends out of one face of the housing body 31a, and the other terminating end of the conductor 35 extends out of the other opposite face of the housing cover 31b. A central portion of the conductor 35, having the shunt resistance 321, is positioned within a component receiving space (not labeled) positioned within the housing body 31a.

The Hall core 311 is positioned to cover the central portion of the conductor 35 and the circuit board 36. The Hall core 311 includes a first surface covering a bottom side of the conductor 35, a second surface and a third surface bent from opposing edges of the first surface and covering both sides of the conductor 35 and the circuit board 36. On an end opposite the first surface, a first end portion and a second end portion bend correspondingly from the second surface and the third surface in a direction in which the first end portion and the second end portion face each other. Based on such a form, a magnetic field to be applied to the Hall core 311 may increase The Hall sensor 312 is positioned in a gap formed between the first end portion and the second end portion of the Hall core 311. A sensing face of the Hall sensor 312 is positioned to allow a magnetic flux induced to the Hall core 311 to be perpendicularly interlinked. Based on such a structure described in the foregoing, a sensitivity of the Hall sensor 312 may be improved.

The Hall core 311 and the Hall sensor 312 are collectively referred to as a Hall sensor module.

The shunt resistance 321, the shunt terminal 322, and the microprocessor 323 are collectively referred to as a shunt sensor module.

The exemplary embodiments discussed above allow the respective advantages and disadvantages of two types of sensors to be complemented by integrating the both types into a single sensor housing. Thus, a faster response speed to a change in a current and a higher accuracy in designing may be achieved. In addition, a production cost and an overall height or width of a product may be reduced.

While this disclosure includes specific examples, it will be apparent to one of ordinary skill in the art that various changes in form and details may be made in these examples without departing from the spirit and scope of the claims and their equivalents. The examples described herein are exemplary, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner and/or replaced or supplemented by other components or their equivalents.

Therefore, the scope of the disclosure is defined not by the detailed description, but by the claims and their equivalents, and all variations within the scope of the claims and their equivalents are to be construed as being included in the disclosure.

What is claimed is:

1. A hybrid current sensor assembly, comprising:
   a conductor having a first terminating end and a second terminating end;
   a Hall core that generates a magnetic field from current flow in the conductor;
   a Hall sensor that measures potential difference between the first terminating end and the second terminating end of the conductor based on the magnetic field applied to the Hall core;
   a shunt terminal positioned on a central portion of the conductor;
   a microprocessor connected to the shunt terminal to measure the current flow in the conductor; and
   a circuit board to which the Hall sensor, the microprocessor, and the shunt terminal are connected, the circuit board having a core receiving passageway into which the Hall core is positioned.

2. The hybrid current sensor assembly of claim 1, further comprising:
   a housing having a component receiving space therein to receive the Hall core, the Hall sensor, the shunt terminal, the microprocessor, and the central portion of the conductor.

3. The hybrid current sensor assembly of claim 2, wherein the first terminating end and the second terminating end of the conductor are externally exposed from the housing, extending outward from opposite sides of the housing.

4. The hybrid current sensor assembly of claim 1, wherein the Hall core is positioned to focus the generated magnetic field on the Hall sensor.

5. The hybrid current sensor assembly of claim 4, wherein the Hall core comprises:
   a first face to cover a bottom side of the conductor;
   a second face bent outward from an edge of the first face; and
   a third face bent outward correspondingly from an opposite edge of the first face so that the second and third faces cover two opposite sides of the conductor.

6. The hybrid current sensor assembly of claim 5, wherein the core receiving passageway is a slot formed in the circuit board, and at least one of the second face and the third face is positioned in the core receiving passageway to extend through the circuit board.

7. The hybrid current sensor assembly of claim 5, wherein the Hall core has
   a first end portion bent from an end of the second face towards the third face; and
   a second end portion bent correspondingly from the third face towards the second face so that the first end portion and the second end portion extend towards each other.

8. The hybrid current sensor assembly of claim 7, wherein the core receiving passageway is a groove linearly recessed in an inward direction from an edge of the circuit board, and at least one of the second face and the third face is slidingly connected to the circuit board through the core receiving passageway.

9. The hybrid current sensor assembly of claim 7, wherein the Hall core is positioned to cover the conductor and the circuit board.

10. The hybrid current sensor assembly of claim 7, wherein the Hall sensor is positioned in a gap between the first end portion and the second end portion of the Hall core.

* * * * *